United States Patent
Banghart et al.

(10) Patent No.: US 8,329,499 B2
(45) Date of Patent: Dec. 11, 2012

(54) METHOD OF FORMING LATERAL OVERFLOW DRAIN AND CHANNEL STOP REGIONS IN IMAGE SENSORS

(75) Inventors: Edmund K. Banghart, Pittsford, NY (US); Eric G. Stevens, Webster, NY (US); Hung Q. Doan, Rochester, NY (US)

(73) Assignee: Truesense Imaging, Inc., Rochester, NY (US)

( * ) Notice: Subject to any disclaimer, the term of this patent is extended or adjusted under 35 U.S.C. 154(b) by 351 days.

(21) Appl. No.: 12/609,296

(22) Filed: Oct. 30, 2009

(65) Prior Publication Data
US 2010/0140729 A1  Jun. 10, 2010

Related U.S. Application Data

(60) Provisional application No. 61/121,227, filed on Dec. 10, 2008, provisional application No. 61/121,249, filed on Dec. 10, 2008.

(51) Int. Cl.
*H01L 21/426* (2006.01)
*H01L 31/14* (2006.01)

(52) U.S. Cl. ............ 438/75; 438/60; 438/526; 438/527; 257/E27.139; 257/E27.145; 257/E27.162

(58) Field of Classification Search ............... 438/75–76, 438/433, 524, 535, 546, 724, 798, 60, 514, 438/526–527; 257/E27.162, E27.139, E27.145
See application file for complete search history.

(56) References Cited

U.S. PATENT DOCUMENTS

| | | | | |
|---|---|---|---|---|
| 4,173,064 A * | 11/1979 | Farnow | ............ | 438/79 |
| 4,672,455 A * | 6/1987 | Miyatake | ............ | 348/311 |
| 4,984,047 A * | 1/1991 | Stevens | ............ | 257/223 |
| 5,114,865 A * | 5/1992 | Kimura | ............ | 438/79 |
| 5,130,774 A | 7/1992 | Stevens et al. | | |
| 5,151,380 A * | 9/1992 | Hynecek | ............ | 438/76 |
| 5,349,215 A | 9/1994 | Anagnostopoulos et al. | | |
| 5,453,632 A * | 9/1995 | Hynecek et al. | ............ | 257/247 |
| 5,585,298 A * | 12/1996 | Stevens et al. | ............ | 438/79 |
| 5,702,971 A * | 12/1997 | Stevens | ............ | 438/79 |
| 5,710,447 A * | 1/1998 | Tohyama | ............ | 257/230 |
| 5,714,776 A * | 2/1998 | Banghart et al. | ............ | 257/223 |
| 5,804,465 A * | 9/1998 | Banghart et al. | ............ | 438/79 |
| 5,877,520 A * | 3/1999 | Hynecek | ............ | 257/223 |
| 5,962,882 A * | 10/1999 | Sin | ............ | 257/222 |
| 6,051,852 A * | 4/2000 | Stevens | ............ | 257/223 |
| 6,136,629 A * | 10/2000 | Sin | ............ | 438/48 |
| 6,545,304 B2 * | 4/2003 | Okamoto | ............ | 257/291 |
| 6,551,910 B2 * | 4/2003 | Ohashi | ............ | 438/519 |
| 6,583,061 B2 * | 6/2003 | Stevens | ............ | 438/700 |
| 6,624,453 B2 * | 9/2003 | Banghart et al. | ............ | 257/223 |

(Continued)

FOREIGN PATENT DOCUMENTS
EP  1 289 019 A2  3/2003

*Primary Examiner* — Matthew Landau
*Assistant Examiner* — Maliheh Malek
(74) *Attorney, Agent, or Firm* — Bingham McCutchen LLP

(57) ABSTRACT

A lateral overflow drain and a channel stop are fabricated using a double mask process. Each lateral overflow drain is formed within a respective channel stop. Due to the use of two mask layers, one edge of each lateral overflow drain is aligned, or substantially aligned, with an edge of a respective channel stop.

20 Claims, 6 Drawing Sheets

U.S. PATENT DOCUMENTS

| | | | |
|---|---|---|---|
| 6,693,671 B1* | 2/2004 | Stevens et al. | 348/314 |
| 6,794,219 B1* | 9/2004 | Stevens et al. | 438/75 |
| 7,235,831 B2* | 6/2007 | Kozuka et al. | 257/292 |
| 7,723,145 B2* | 5/2010 | Kuriyama | 438/60 |
| 2002/0094599 A1* | 7/2002 | Hynecek | 438/79 |
| 2002/0140003 A1 | 10/2002 | Mizobuchi et al. | |
| 2003/0045109 A1* | 3/2003 | Stevens | 438/700 |
| 2003/0160295 A1* | 8/2003 | Okita | 257/506 |
| 2003/0170928 A1* | 9/2003 | Shimozono et al. | 438/73 |
| 2003/0234409 A1* | 12/2003 | Toma | 257/222 |
| 2004/0007722 A1* | 1/2004 | Narui et al. | 257/228 |
| 2004/0108502 A1* | 6/2004 | Nakamura et al. | 257/61 |
| 2005/0088556 A1* | 4/2005 | Han | 348/308 |
| 2005/0116259 A1* | 6/2005 | Komori | 257/222 |
| 2006/0081956 A1* | 4/2006 | Kaida | 257/444 |
| 2006/0166389 A1* | 7/2006 | Miyamoto et al. | 438/22 |
| 2006/0270096 A1* | 11/2006 | Brady et al. | 438/73 |
| 2007/0069315 A1* | 3/2007 | Stevens et al. | 257/431 |
| 2007/0158770 A1* | 7/2007 | Kawahito | 257/431 |
| 2008/0182354 A1* | 7/2008 | Lee et al. | 438/59 |
| 2009/0114919 A1* | 5/2009 | Kawahito et al. | 257/59 |
| 2009/0258456 A1* | 10/2009 | Hatai | 438/75 |
| 2010/0047950 A1* | 2/2010 | Kim | 438/57 |
| 2010/0140728 A1* | 6/2010 | Banghart et al. | 257/431 |
| 2011/0298024 A1* | 12/2011 | Kitano et al. | 257/294 |

* cited by examiner

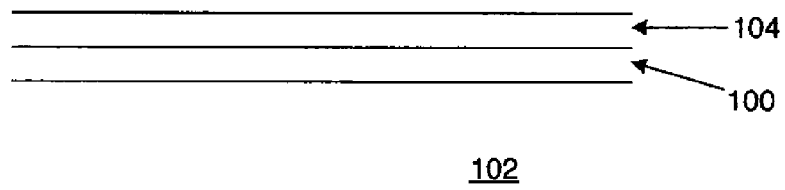
FIG. 1 - Prior Art
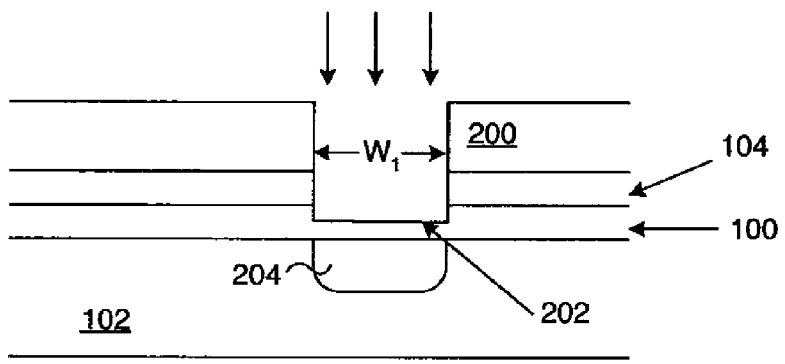
FIG. 2 - Prior Art
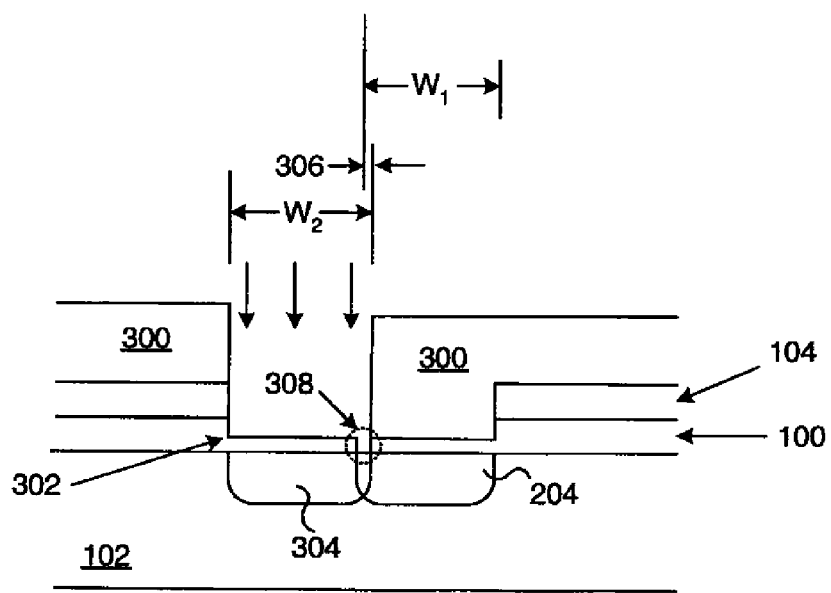
FIG. 3 - Prior Art

METHOD OF FORMING LATERAL OVERFLOW DRAIN AND CHANNEL STOP REGIONS IN IMAGE SENSORS

CROSS-REFERENCE TO RELATED APPLICATIONS

This application claims the benefit of U.S. Provisional Application No. 61/121,227 filed on Dec. 10, 2008, and U.S. Provisional Application No. 61/121,249 filed on Dec. 10, 2008, both of which are incorporated herein by reference. This application is related to pending U.S. patent application Ser. No. 12/609,257 filed on Oct. 30, 2009.

TECHNICAL FIELD

The present invention relates generally to image sensors for use in digital cameras and other types of image capture devices, and more particularly to image sensors having lateral overflow drain and channel stop regions.

BACKGROUND

A typical electronic image sensor includes a number of photosensitive picture elements ("pixels") arranged in a two-dimensional array. The pixels accumulate charge carriers in response to light striking the pixels, and each pixel has a maximum amount of charge it can store. A phenomenon known as "blooming" occurs when the total number of charge carriers collected by a pixel exceeds the charge capacity for that pixel and the excess charge spills over into adjacent pixels. One known anti-blooming technique forms a lateral overflow drain (LOD) within a pixel to provide a means for draining the excess charge carriers from the pixel before the charge carriers spill into adjacent pixels.

FIGS. 1-3 depict a method of forming lateral overflow drain and channel stop regions in accordance with the prior art. Initially, as shown in FIG. 1, an insulating layer 100 is formed over a substrate or well 102. A nitride layer 104 is then formed over the insulating layer 100.

FIG. 2 illustrates mask layer 200 formed on nitride layer 104 and patterned to form an opening having a width $W_1$. The portion of nitride layer 104 that is exposed in the opening is etched away. Nitride layer 104 is commonly over etched to accommodate for variations in the thickness of nitride layer 104. This overetching removes a portion 202 of insulating layer 100. A dopant is then implanted into substrate 102 (represented by arrows) to form channel stop 204. Channel stop 204 prevents charge carriers from spilling to horizontally adjacent pixels.

Mask layer 200 is then removed and another mask layer 300 is formed on the remaining nitride layer 104 and the exposed portion of insulating layer 100 (FIG. 3). Mask layer 300 is patterned to form an opening having a width $W_2$, and the portion of nitride layer 104 exposed in the second opening is etched away. Again, nitride layer 104 is typically over etched to account for variations in the thickness of nitride layer 104, thereby removing another portion 302 of insulating layer 100. A dopant is then implanted into substrate 102 (represented by arrows) to form lateral overflow drain 304.

To ensure that all of nitride layer 104 that overlies the lateral overflow drain region is removed prior to the formation of the lateral overflow drain 302, $W_2$ typically overlaps with $W_1$, creating overlap area 306. When nitride layer 104 is etched as shown in FIGS. 2 and 3, the portion 308 of insulating layer 100 located in overlap area 306 is etched twice. This double-etching can remove portion 308 completely, thereby exposing the top surface of substrate 102 and allowing the substrate surface to be damaged during subsequent processing steps. Exposing or damaging the top surface of substrate 102 can potentially result in contamination of substrate 102 and produce defects in the image sensor, such as, for example, cluster defects.

SUMMARY

A lateral overflow drain and a channel stop are fabricated using a double mask layer process. A hard mask layer is formed over an insulating layer. The insulating layer is disposed on a substrate, layer, or well having a first conductivity type. The hard mask layer is patterned to create one or more first openings. A second mask layer is then formed on the hard mask layer and patterned to create one or more second openings. Each second opening is disposed in a portion of a respective first opening, and a portion of the second mask layer is disposed in the remaining portion of the first opening.

One or more dopants having a second conductivity type opposite the first conductivity type are then implanted through each second opening and into the substrate, layer, or well to form one or more lateral overflow drains. The second mask layer is then removed, and one or more dopants having the same conductivity type as the substrate, layer, or well are implanted through the first openings and into the lateral overflow drains and adjoining substrate, layer, or well to form channel stops. Due to the use of two mask layers, one edge of each lateral overflow drain is aligned, or substantially aligned, with an edge of a respective channel stop. The hard mask layer is then removed and the device processed further using known fabrication steps.

ADVANTAGEOUS EFFECT OF THE INVENTION

The present invention includes the advantage of forming one or more lateral overflow drains without damaging any underlying layers. Additionally, the present invention provides accurate and repeatable methods for fabricating lateral overflow drains and channel stops with minimal feature sizes. This is particularly beneficial in high resolution image sensors.

BRIEF DESCRIPTION OF THE DRAWINGS

Embodiments of the invention are better understood with reference to the following drawings. The elements of the drawings are not necessarily to scale relative to each other.

FIGS. 1-3 depict a method of forming lateral overflow drain and channel stop regions in accordance with the prior art;

DETAILED DESCRIPTION

Figure 4:
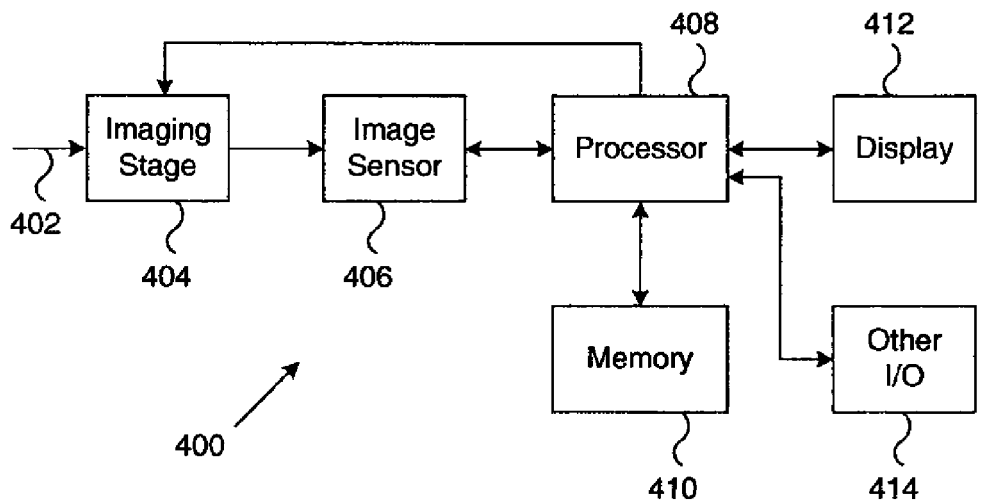
FIG. 4 is a simplified block diagram of an image capture device in an embodiment in accordance with the invention.

Throughout the specification and claims, the following terms take the meanings explicitly associated herein, unless the context clearly dictates otherwise. Directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

Additionally, the terms "wafer" and "substrate" are to be understood as a semiconductor-based material including, but not limited to, silicon, silicon-on-insulator (SOI) technology, doped and undoped semiconductors, epitaxial layers fanned on a semiconductor substrate, and other semiconductor structures.

Referring to the drawings, like numbers indicate like parts throughout the views.

FIG. 4 is a simplified block diagram of an image capture device in an embodiment in accordance with the invention. Image capture device 400 is implemented as a digital camera in FIG. 4. Those skilled in the art will recognize that a digital camera is only one example of an image capture device that can utilize an image sensor incorporating the present invention. Other types of image capture devices, such as, for example, cell phone cameras, scanners, and digital video camcorders can be used with the present invention.

In digital camera 400, light 402 from a subject scene is input to an imaging stage 404. Imaging stage 404 can include conventional elements such as a lens, a neutral density filter, an iris and a shutter. Light 402 is focused by imaging stage 404 to form an image on image sensor 406. Image sensor 406 captures one or more images by converting the incident light into electrical signals. Digital camera 400 further includes processor 408, memory 410, display 412, and one or more additional input/output (I/O) elements 414. Although shown as separate elements in the embodiment of FIG. 4, imaging stage 404 may be integrated with image sensor 406, and possibly one or more additional elements of digital camera 400, to form a camera module. For example, a processor or a memory may be integrated with image sensor 406 in a camera module in embodiments in accordance with the invention.

Processor 408 may be implemented, for example, as a microprocessor, a central processing unit (CPU), an application-specific integrated circuit (ASIC), a digital signal processor (DSP), or other processing device, or combinations of multiple such devices. Various elements of imaging stage 404 and image sensor 406 may be controlled by timing signals or other signals supplied from processor 408.

Memory 410 may be configured as any type of memory, such as, for example, random access memory (RAM), read-only memory (ROM), Flash memory, disk-based memory, removable memory, or other types of storage elements, in any combination. A given image captured by image sensor 406 may be stored by processor 408 in memory 410 and presented on display 412. Display 412 is typically an active matrix color liquid crystal display (LCD), although other types of displays may be used. The additional I/O elements 414 may include, for example, various on-screen controls, buttons or other user interfaces, network interfaces, or memory card interfaces.

It is to be appreciated that the digital camera shown in FIG. 4 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 5:
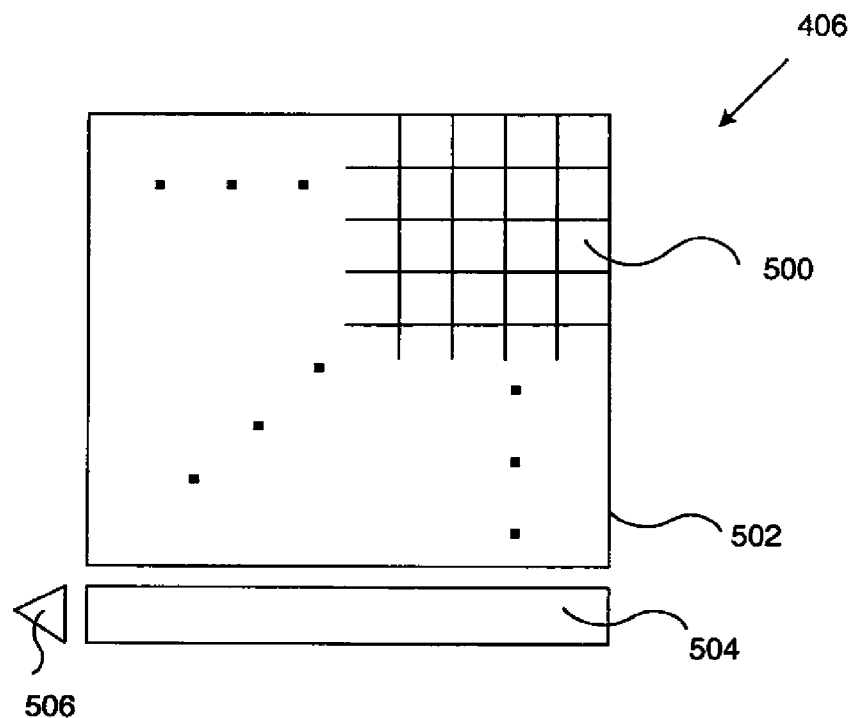
FIG. 5 is a simplified block diagram of image sensor 406 shown in FIG. 4 in an embodiment in accordance with the invention.

Referring now to FIG. 5, there is shown a simplified block diagram of image sensor 406 shown in FIG. 4 in an embodiment in accordance with the invention. Image sensor 406 is implemented as a true two-phase full frame Charge Coupled Device (CCD) image sensor (described later) in FIG. 4. Other embodiments in accordance with the invention are not limited to this type of image sensor. By way of example only, image sensor 406 may be implemented as an interline CCD image sensor, or a three or four phase CCD image sensor in other embodiments in accordance with the invention.

Image sensor 406 includes a number of pixels 500 typically arranged in rows and columns to form an imaging area 502. Each pixel 500 is configured as a shift element with each column of pixels forming a vertical shift register. After an image is captured by pixels 500, the accumulated charges are read out of imaging area 502. During image readout, the vertical shift registers shift each row of accumulated charges or signals out to horizontal shift register 504. Horizontal shift register 504 then sequentially shifts the charges to output amplifier 506.

Figure 6:
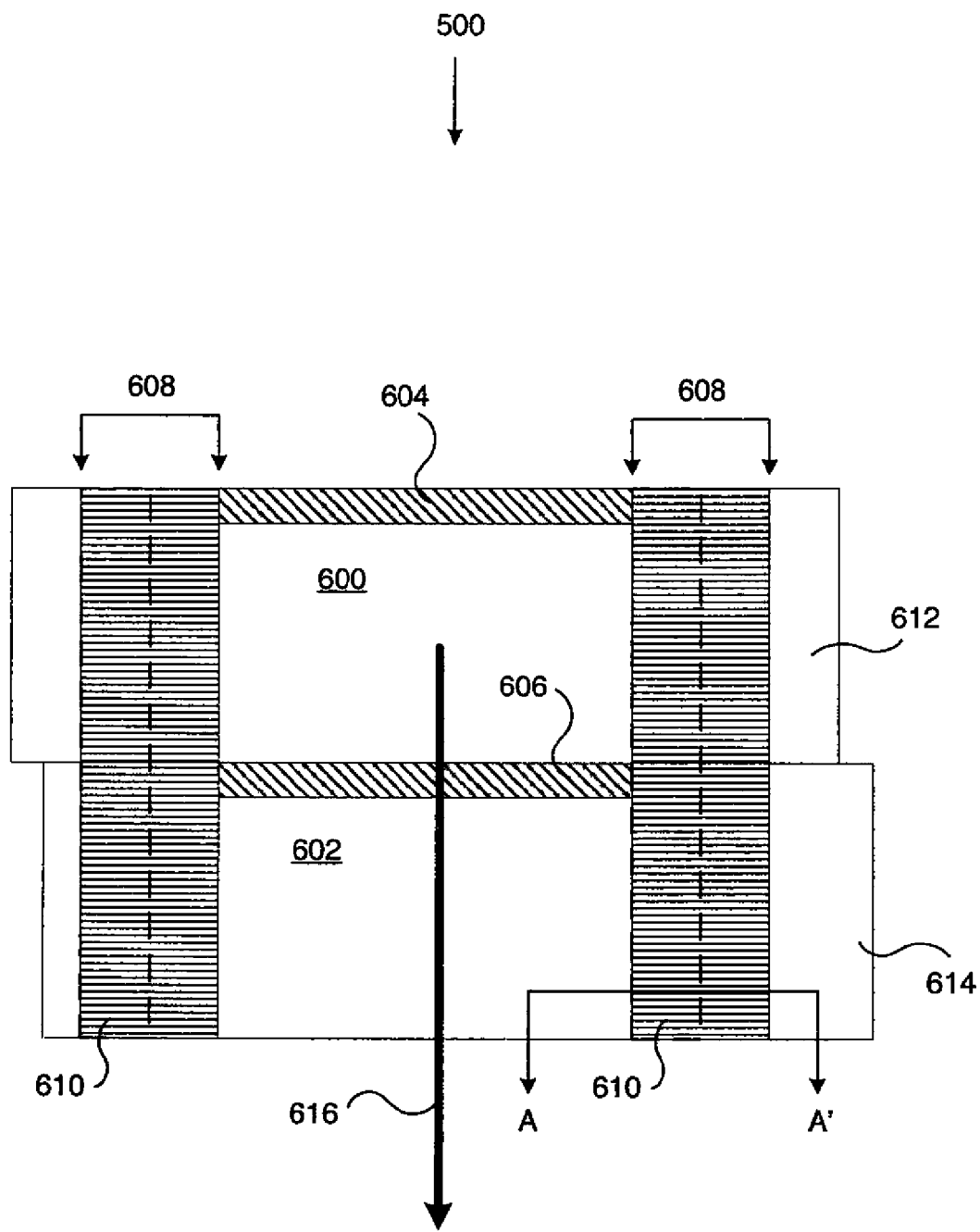
FIG. 6 is a simplified diagram of pixel 500 shown in FIG. 5 in an embodiment in accordance with the invention.

FIG. 6 is a simplified diagram of pixel 500 shown in FIG. 5 in an embodiment in accordance with the invention. As discussed earlier, image sensor 406 in FIG. 5 is implemented as a true two-phase CCD image sensor. When a CCD image sensor includes multiple phases, the vertical CCDs are each separated into multiple parts or "phases" to facilitate the transfer of charge through the structures. Thus, in a true two-phase CCD, each shift element in a vertical CCD has a first phase shift element 600 and a second phase shift element 602.

Barrier regions 604, 606 separate each shift element 600, 602 in pixel 500 from vertically adjacent pixels and facilitate the transfer of charge through the vertical CCD. Channel stop 608 is formed within pixel 500 to prevent charge from spilling to horizontally adjacent pixels. Lateral overflow drain 610 (shown in dashed lines) is formed within channel stop 608, and is used to drain excess or undesirable charge from pixel 500. Lateral overflow drain 610 has a higher dopant concentration than the dopant concentration of channel stop 608 in an embodiment in accordance with the invention.

Overflow bather regions are also formed in pixel 500. The overflow barrier regions are not shown in FIG. 6 for the sake of clarity. Overflow barrier regions can be designed and fabricated using any known fabrication method. Overflow bather regions are described, for example, in U.S. Pat. Nos. 5,130,774 and 5,349,215.

And finally, gate electrodes 612, 614 are formed over pixel 500 and are made of a transparent material that allows light to pass through electrodes 612, 614. Examples of a transparent material include, but are not limited to, polysilicon and indium-tin-oxide (ITO). Gate electrodes 612, 614 activate the transfer of charge through shift elements 600, 602. A voltage is alternately applied to each gate electrode 612, 614 to shift charge from one shift element to the next shift element. Arrow 616 indicates the direction of the charge transfer through each vertical shift register.

Figure 7:
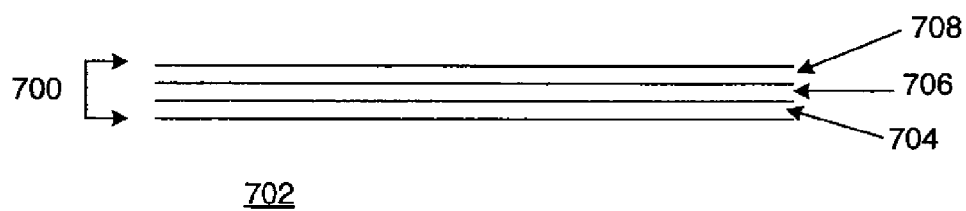
FIGS. 7-12 are cross section views of a portion of pixel 500 along line A-A' in FIG. 6 illustrating a method of forming lateral overflow drain 610 and channel stop 608 in an embodiment in accordance with the invention.

Referring now to FIGS. 7-12, there are shown cross section views of a portion of pixel 500 along line A-A' in FIG. 6 that illustrate a method of forming lateral overflow drain 610 and channel stop 608 in an embodiment in accordance with the invention. FIG. 7 depicts a portion of a pixel after a number of initial fabrication steps have been completed. The pixel at this stage includes an insulating layer 700 formed over layer 702. By way of example only, insulating layer 700 is implemented as an oxide-nitride-oxide (ONO) layer (layers 704, 706, and 708, respectively) in an embodiment in accordance with the invention. Layer 702 is configured as a substrate, layer, or well having either an n or p conductivity type.

Figure 8:
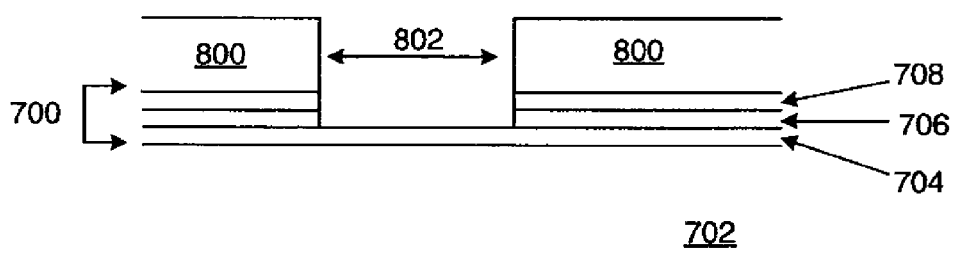

Hard mask layer 800 is then formed over insulating layer 700 and patterned to form opening 802 (FIG. 8). By way of example only, hard mask layer 800 can be formed as a silicon nitride or silicon dioxide layer. The portions of oxide layer 708 and nitride layer 706 that are exposed in opening 802 are removed. Oxide layer 704 is not removed and acts as a protection and screening layer in an embodiment in accordance with the invention.

Figure 9:
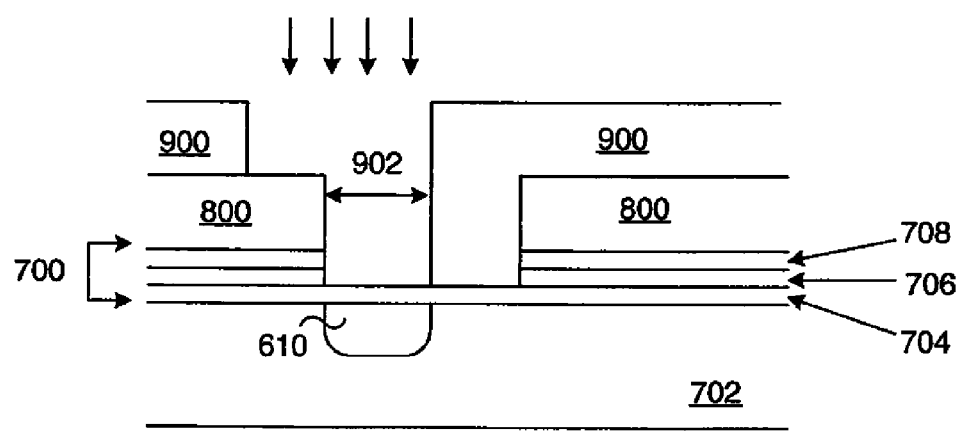

A second mask layer 900 is then formed on hard mask layer 800 and patterned to form opening 902 (FIG. 9). Second mask layer 900 is formed by depositing a photoresist on hard mask layer 800 in an embodiment in accordance with the invention. Opening 902 resides in a portion of opening 802 with second mask layer 900 filling in the remaining portion of opening 802.

One or more dopants are then implanted into layer 702 (represented by arrows) to form lateral overflow drain 610. The dopant or dopants used to form lateral overflow drain 610 are of the opposite conductivity type from the conductivity type of layer 702. For example, if layer 702 includes p-type dopants, then lateral overflow drain 610 is formed with n-type dopants. Arsenic is an exemplary n-type dopant that can be implanted with a concentration of $1 \times 10^{14}$ atoms per square centimeter to form lateral overflow drain 610.

Figure 10:
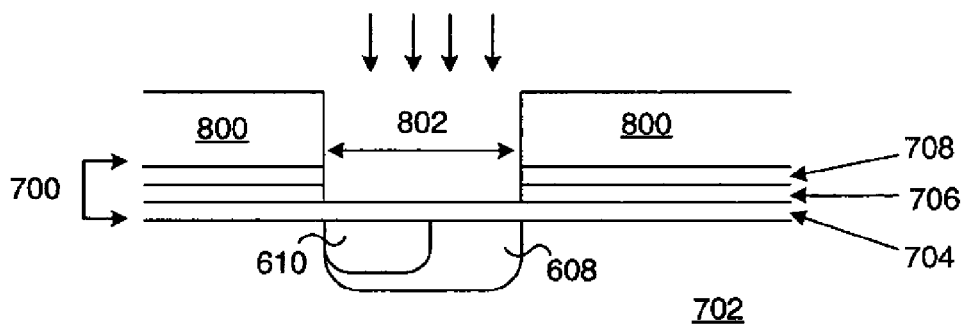

Next, as shown in FIG. 10, mask layer 900 is removed and one or more dopants are implanted (represented by arrows) through opening 802 and into lateral overflow drain 610 and an adjoining portion of layer 702 to form channel stop 608. The one or more dopants used to form channel stop 608 have the same conductivity type as layer 702. For example, if layer 702 has p-type conductivity, the dopant or dopants used to form channel stop 608 are p-type dopants in an embodiment in accordance with the invention. By way of example only, boron is a p-type dopant that can be implanted with a concentration of $1 \times 10^{13}$ atoms per square centimeter to form channel stop 608.

Due to the use of two mask layers 800 and 900, one edge of lateral overflow drain 610 is aligned, or substantially aligned, with an edge of channel stop 608. Hard mask layer 800 is then removed, resulting in the structure shown in FIG. 11. A field oxide region 1200 is formed over channel stop 608 and lateral overflow drain 610 (FIG. 12). Field oxide region 1200 can be formed using any known method. Pixel 500 can now be processed further. Subsequent processing steps may include the formation of a buried channel, an overflow bather region disposed adjacent to lateral overflow drain 610, and an overlying gate electrode.

Figure 13:
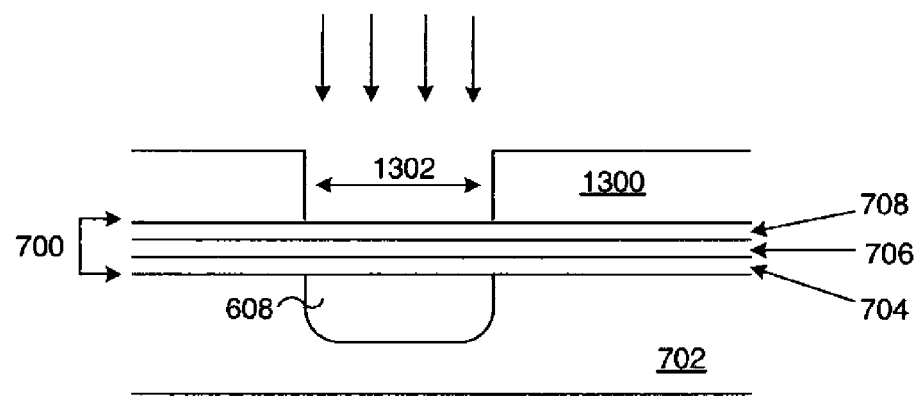
FIGS. 13-15 are cross section views of a portion of pixel 500 along line A-A' in FIG. 6 illustrating alternate techniques that can be performed instead of the techniques shown in FIGS. 8-10 in an embodiment in accordance with the invention.
Figure 14:
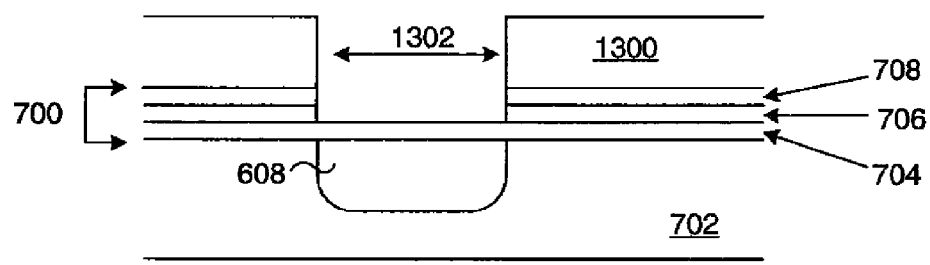
Figure 15:
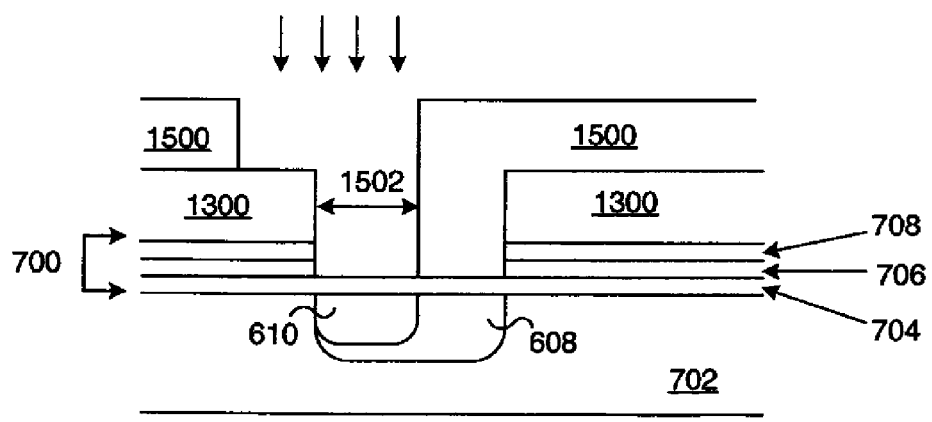

FIGS. 13-15 are cross section views of a portion of pixel 500 along line A-A' in FIG. 6 illustrating alternate techniques that can be performed instead of the techniques shown in FIGS. 8-10 in an embodiment in accordance with the invention. The processing step shown in FIG. 13 is performed after FIG. 7. Mask layer 1300 is formed on insulating layer 700 and patterned to create first opening 1302 (FIG. 13). Mask layer 1300 is formed by depositing a photoresist on insulating layer 700 in an embodiment in accordance with the invention. In another embodiment in accordance with the invention, mask layer 1300 is formed by depositing a hard mask layer over insulating layer 700.

One or more dopants are then implanted (represented by arrows) through opening 1302 and into layer 702 to form channel stop 608. The one or more dopants used to form channel stop 608 have the same conductivity type as layer 702. For example, if layer 702 has p-type conductivity, the dopant or dopants used to form channel stop 608 are p-type dopants in an embodiment in accordance with the invention. Boron is an exemplary p-type dopant that can be implanted with a concentration of $1 \times 10^{13}$ atoms per square centimeter to form channel stop 608. In another embodiment in accordance with the invention, one or more n-type dopants can be used to form channel stop 608 when layer 702 has an n-type conductivity.

Next, as shown in FIG. 14, oxide layer 708 and nitride layer 706 that are exposed in opening 1302 are removed. Oxide layer 708 and nitride layer 706 are etched with a plasma etch in an embodiment in accordance with the invention. Oxide layer 704 is not removed and acts as a protection and screening layer in an embodiment in accordance with the invention.

Mask layer 1500 is then formed over mask layer 1300 and patterned to create second opening 1502 (FIG. 15). Mask layer 1500 is formed by depositing a photoresist over mask layer 1300 in an embodiment in accordance with the invention. Second opening 1502 is disposed in a portion of first opening 1302, and a portion of mask layer 1500 is disposed in the remaining portion of opening 1302.

One or more dopants are then implanted (represented by arrows) through opening 1502 and into channel stop 608 to form lateral overflow drain 610. Due to the dual-mask layers 1300 and 1500, one edge of lateral overflow drain 610 is aligned, or substantially aligned, with an edge of channel stop 608. The dopant or dopants used to form lateral overflow drain 610 are of the opposite conductivity type from channel stop 608. For example, if channel stop 608 includes p-type dopants, then lateral overflow drain 610 is formed with n-type dopants. By way of example only, arsenic is an n-type dopant that can be implanted with a concentration of $1 \times 10^{14}$ atoms per square centimeter to form lateral overflow drain 610.

Figure 11:
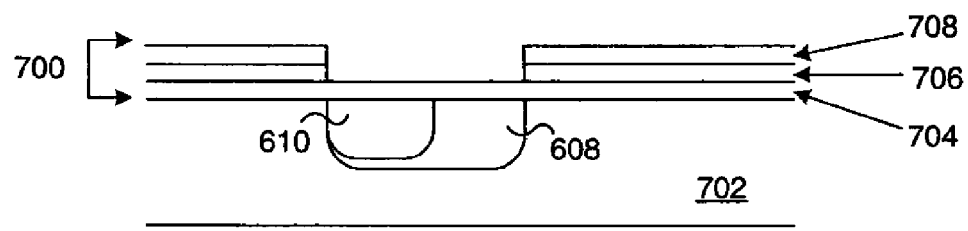
Figure 12:
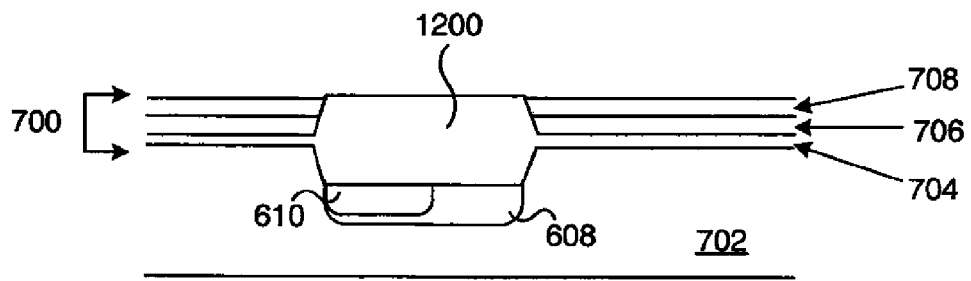

Mask layer 1500 and mask layer 1300 in FIG. 15 are removed after lateral overflow drain 610 is formed, resulting in the pixel structure depicted in FIG. 11. Field oxide region 1200 is now formed over channel stop 608 and lateral overflow drain 610, as shown in FIG. 12. Field oxide region 1200 can be formed using any known method. Pixel 500 can now be processed further. Subsequent processing steps may include the formation of a buried channel, an overflow bather region disposed adjacent to lateral overflow drain 610, and an overlying gate electrode.

Lateral overflow drains 610 and channel stops 608 formed by the methods shown in FIGS. 7-15 can have smaller dimensions than prior art structures. This is because the sizes of opening 902 in FIG. 9 and opening 1502 in FIG. 15 are smaller than the achievable minimum sizes for openings 802 (FIG. 8) and 1302 (FIG. 13). When formed using conventional lithography techniques, the smallest dimensions for openings 802 and 1302 are defined and constrained by the minimum dimensions that can be obtained with conventional lithography. But, since openings 902 and 1502 are formed within openings 802 and 1302, respectively, openings 902 and 1502 have smaller dimensions than openings 802 and 1302. Thus, the present invention provides accurate and repeatable methods for fabricating lateral overflow drains and channel stops with minimal feature sizes.

The invention has been described with reference to particular embodiments in accordance with the invention. However, it will be appreciated that variations and modifications can be effected by a person of ordinary skill in the art without departing from the scope of the invention. By way of example only, the order in which the fabrication steps shown in FIG. 8 and in FIGS. 9-10 can be reversed. Thus, oxide layer 708 and nitride layer 706 that are exposed in opening 802 are removed after the formation of lateral overflow drain 610 and channel stop 608. Additionally, the conductivity types of layer 702 and channel stop 608 can be n-type while the conductivity type of lateral overflow drain is p-type.

Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST

100 insulating layer
102 substrate, layer, or well
104 nitride layer
200 mask layer
202 portion of insulating layer
204 channel stop
300 mask layer
302 portion of insulating layer
304 lateral overflow drain
306 overlap area
308 portion of insulating layer
400 image capture device
402 light
404 imaging stage
406 image sensor
408 processor
410 memory
412 display
414 other input/output (I/O) elements
500 pixel
502 imaging area
504 horizontal shift register
506 output amplifier
600 shift element
602 shift element
604 barrier region
606 barrier region
608 channel stop
610 lateral overflow drain
612 gate electrode
614 gate electrode
616 arrow representing direction of charge transfer
700 insulating layer
702 layer
704 oxide layer
706 nitride layer
708 oxide layer
800 hard mask layer
802 opening
900 second mask layer
902 opening
1200 field oxide
1300 mask layer
1302 opening
1500 mask layer
1502 opening

The invention claimed is:

1. A method of forming a lateral overflow drain and a channel stop associated with a pixel of an image sensor, the pixel comprising one or more shift elements for the accumulation of charge carriers in response to exposure to light, the method comprising:
   forming a first mask layer over a semiconductor layer;
   removing a portion of the first mask layer, thereby forming a first opening;
   forming a second mask layer over the first mask layer;
   removing a portion of the second mask layer to form a second opening disposed within and sharing a boundary with the first opening;
   introducing dopants having a first conductivity type into the semiconductor layer through only the second opening, thereby forming a lateral overflow drain for draining excess charge carriers from the one or more shift elements;
   removing a remaining portion of the second mask layer; and
   after removing the remaining portion of the second mask layer, introducing dopants having a second conductivity type opposite the first conductivity type into the semiconductor layer through the first opening, thereby forming a channel stop for preventing movement of charge carriers from the one or more shift elements into a second pixel adjacent to the pixel,
   wherein the lateral overflow drain is disposed within and substantially shares a boundary with the channel stop.

2. The method of claim 1, further comprising forming a field oxide region over the channel stop and the lateral overflow drain.

3. The method of claim 1, wherein the channel stop is formed before the second opening is formed.

4. The method of claim 1, wherein the lateral overflow drain is formed before the channel stop is formed.

5. The method of claim 1, wherein at least one of (i) the dopants having the first conductivity type or (ii) the dopants having the second conductivity type are introduced into the semiconductor layer through an insulating layer disposed over the semiconductor layer.

6. The method of claim 1, wherein the semiconductor layer comprises a semiconductor-based substrate.

7. The method of claim 1, wherein the first mask layer comprises a hard mask.

8. The method of claim 7, wherein the first mask layer comprises at least one of an oxide layer or a nitride layer.

9. The method of claim 1, wherein the first mask layer comprises photoresist.

10. The method of claim 1, wherein the second mask layer comprises photoresist.

11. The method of claim 1, wherein a width of the channel stop is greater than a width of the lateral overflow drain.

12. A method of forming a lateral overflow drain and a channel stop associated with a pixel of an image sensor, the pixel comprising one or more shift elements for the accumulation of charge carriers in response to exposure to light, the method comprising:
   forming a first mask layer over a semiconductor layer;
   removing a portion of the first mask layer, thereby forming a first opening;
   forming a second mask layer over the first mask layer;

removing a portion of the second mask layer to form a second opening disposed within and sharing a boundary with the first opening;

introducing dopants having a first conductivity type into the semiconductor layer through only the second opening, thereby forming a lateral overflow drain for draining excess charge carriers from the one or more shift elements; and introducing dopants having a second conductivity type opposite the first conductivity type into the semiconductor layer through the first opening, thereby forming a channel stop for preventing movement of charge carriers from the one or more shift elements into a second pixel adjacent to the pixel, wherein (i) the lateral overflow drain is disposed within and substantially shares a boundary with the channel stop and (ii) the lateral overflow drain is formed before the channel stop is formed.

13. The method of claim 12, further comprising forming a field oxide region over the channel stop and the lateral overflow drain.

14. The method of claim 12, wherein at least one of (i) the dopants having the first conductivity type or (ii) the dopants having the second conductivity type are introduced into the semiconductor layer through an insulating layer disposed over the semiconductor layer.

15. The method of claim 12, wherein the semiconductor layer comprises a semiconductor-based substrate.

16. The method of claim 12, wherein the first mask layer comprises a hard mask.

17. The method of claim 16, wherein the first mask layer comprises at least one of an oxide layer or a nitride layer.

18. The method of claim 12, wherein the first mask layer comprises photoresist.

19. The method of claim 12, wherein the second mask layer comprises photoresist.

20. The method of claim 12, wherein a width of the channel stop is greater than a width of the lateral overflow drain.

* * * * *